United States Patent [19]

Akiba et al.

[11] Patent Number: 4,660,934

[45] Date of Patent: Apr. 28, 1987

[54] METHOD FOR MANUFACTURING DIFFRACTION GRATING

[75] Inventors: Shigeyuki Akiba, Tokyo; Katsuyuki Utaka, Musashino; Kazuo Sakai, Tokyo; Yuichi Matsushima, Tanashi, all of Japan

[73] Assignee: Kokusai Denshin Denwa Kabushiki Kaisha, Tokyo, Japan

[21] Appl. No.: 710,984

[22] Filed: Mar. 12, 1985

[30] Foreign Application Priority Data

Mar. 21, 1984 [JP] Japan .................................. 59-52100
Dec. 11, 1984 [JP] Japan ................................ 59-529980

[51] Int. Cl.⁴ ............................................. G02B 5/18
[52] U.S. Cl. ..................................... 350/320; 350/166; 350/162.17; 430/299
[58] Field of Search ................... 350/320, 1.1, 162.15, 350/162.17, 162.19, 162.20, 162.23, 162.24, 164, 166, 162; 430/297, 298, 299, 313, 2

[56] References Cited

U.S. PATENT DOCUMENTS

| | | | |
|---|---|---|---|
| 3,510,371 | 5/1970 | Frankson | 350/320 |
| 4,140,362 | 2/1979 | Tien | 350/162.17 |
| 4,297,436 | 10/1981 | Kubotera et al. | 430/299 |
| 4,313,648 | 2/1982 | Yano et al. | 350/166 |
| 4,410,237 | 10/1983 | Veldkamp | 350/162.2 |

Primary Examiner—John K. Corbin
Assistant Examiner—Loha Ben
Attorney, Agent, or Firm—Robert E. Burns; Emmanuel J. Lobato; Bruce L. Adams

[57] ABSTRACT

A method for manufacturing diffraction grating, in which after forming, on a substrate, one of a negative type photoresist film (an N film) and a positive type photoresist film (a P film) to cover a first region A and the other of the negative type photoresist film and the positive type photoresist film, or the latter film on the former one to cover a second region B, the first region and the second region are subjected to two-beam interference exposure, thereby forming a diffraction grating in which corrugations in the first region and the second region are reverse in phase to each other, through utilization of characteristics of the negative type photoresist film and the positive type photoresist film. Another feature of the present invention resides in that after forming, on a substrate, a structure in which a negative type photoresist film (an N film) is formed to cover only a first region A and the negative type photoresist film is formed on a positive type photoresist film (a P film) to cover a second region B, the first region and the second region of the substrate are subjected to two-beam interference exposure, thereby forming a diffraction grating in which corrugations in the first region and the second region are reverse in phase to each other, through utilization of characteristics of the negative type photoresist film and the positive type photoresist film.

9 Claims, 53 Drawing Figures

Fig. 8A
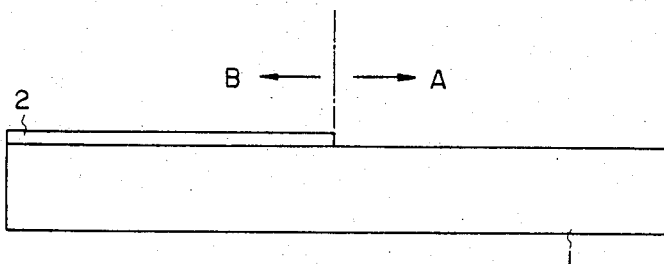
Fig. 8B
Fig. 8C
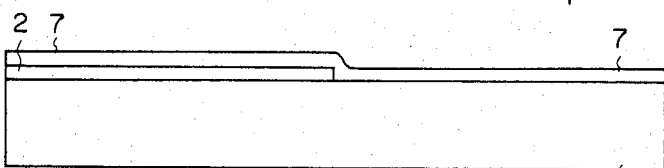
Fig. 8D
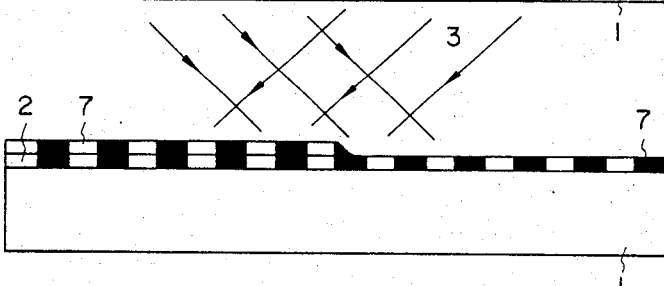
Fig. 8E
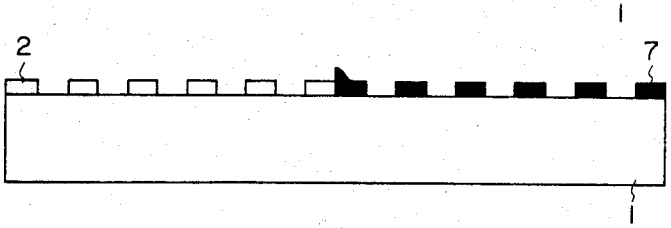
Fig. 8F
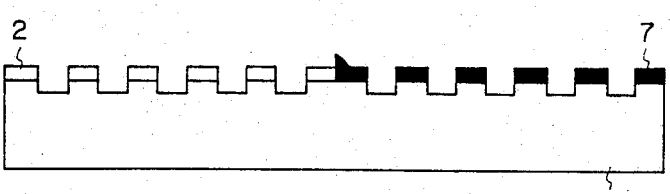

METHOD FOR MANUFACTURING DIFFRACTION GRATING

BACKGROUND OF THE INVENTION

The present invention relates to a method for manufacturing a diffraction grating having periodic corrugations through utilization of two-beam interference exposure, and more particularly to a method of making a diffraction grating which has a structure such that the phases of corrugations in two adjacent regions are reverse to each other.

Since such a diffraction grating having periodic corrugations reflects or passes therethrough light of a desired wavelength alone, it is used, in the field of optical communications, as a filter or an internal element of a distributed feedback semiconductor lasers (hereinafter referred to simply as "DFB lasers").

Of such lasers, a DFB laser of the type having a diffraction grating in a light emitting region or in its vicinity emits light of a single mode, and hence is highlighted as a light source for optical communications, and a variety of proposals have been made on this laser. Especially in recent years, it has attracted attention to reverse the phase of corrugations near the center portion of the diffraction grating for further stabilization of the single mode operation.

The oscillation wavelength of such a DFB laser is determined by the period $\Lambda$ of the corrugations of the diffraction grating, and its stable operation depends upon the accuracy of fabrication of the diffraction grating. Accordingly, the fabrication accuracy of the diffraction grating affects the characteristics of the DFB laser.

As described above, it has been difficult to manufacture, by the conventional two-beam interference exposure technique, the diffraction grating of the type in which the phase of the periodic corrugations is reversed.

SUMMARY OF THE INVENTION

An object of the invention is to provide a method for manufacturing a diffraction grating capable of implementing the diffraction grating of the structure in which the phase of the periodic corrugations is reversed, through the use of a two-beam interference exposure technique which is easy and excellent in mass-productivity as compared with the electron beam exposure process.

A feature of the present invention resides in that after forming, on a substrate, one of a negative type photoresist film (an N film) and a positive type photoresist film (a P film) to cover a first region A and the other of the negative type photoresist film and the positive type photoresist film, or the latter film on the former one to cover a second region B, the first region and the second region are subjected to two-beam interference exposure, thereby forming a diffraction grating in which corrugations in the first region and the second region are reverse in phase to each other, through utilization of characteristics of the negative type photoresist film and the positive type photoresist film.

Another feature of the present invention resides in that after forming, on a substrate, a structure in which a negative type photoresist film (an N film) is formed to cover only a first region A and the negative type photoresist film is formed on a positive type photoresist film (a P film) to cover a second region B, the first region and the second region of the substrate are subjected to two-beam interference exposure, thereby forming a diffraction grating in which corrugations in the first region and the second region are reverse in phase to each other, through utilization of characteristics of the negative type photoresist film and the positive type photoresist films.

BRIEF DESCRIPTION OF THE DRAWINGS

The present invention will be described in detail below in comparison with prior art with reference to the accompanying drawings, in which:

FIGS. 4A to 4F, 5A to 5H, 6A to 6K, 7A to 7J and 8A to 8F are diagrams illustrating manufacturing steps of other embodiments of the present invention.

DETAILED DESCRIPTION

A description will be given first of a method for the manufacture of a diffraction grating of the type that the phase of corrugations is not reversed, which will be followed by a description of a conventional manufacturing method of the diffraction grating of the type having the phase of corrugations reversed.

Figure 1:
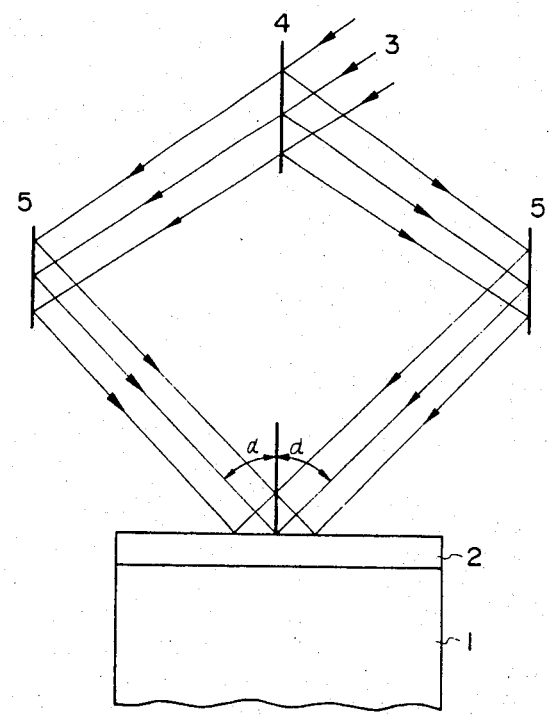
FIG. 1 is a diagram showing the principles of a conventional two-beam interference exposure method.

FIG. 1 is a schematic diagram explanatory of the principles of fabrication of a uniform diffraction grating through the use of a conventional two-beam interference exposure technique. For example, He-Cd laser light 3 of a wavelength $\lambda_0$ is divided by a half mirror 4 into two; each divided light 3 is reflected by a mirror 5; and their composite wave is applied to a crystal surface 1 formed, for example, by coating a positive type photoresist film 2 on a substrate 1, as shown, so that the substrate surface is exposed by the resulting interference light. Then, by etching away the irradiated surface, the diffraction grating can be obtained. Now, letting the angle of incidence of the laser light 3 be represented by $\alpha$, the period $\Lambda$ of the irregularities is given by $$A = \frac{\lambda_0}{2 \sin \alpha} \quad (1)$$

On the other hand, as a method for the manufacture of the diffraction grating of the structure in which phase of corrugations is reversed at the center of the laser, there has been proposed a method of exposure by electron beam scanning under the control of a computer. With this method, parts corresponding to grooves of the diffraction grating are exposed by sequential electron beam scanning. This method is applicable to the case of the period $\Lambda$ of corrugations being long, but when the period $\Lambda$ is short (about 2000 Å) as in the case of a first-order diffraction grating in which the period $\Lambda$ is one-half the wavelength of light in the crystal, the limit of resolution is reached, making the manufacture essentially difficult. Further, the electron beam exposure method involves individual and sequential scanning, and hence consumes an appreciable amount of time for scanning the entire area of a diffraction grating pattern; therefore, it is difficult to apply this method to a mass-production process.

Next, a description will be given of problems which are encountered in a case of producing, by the use of the two-beam interference exposure technique, the diffraction grating of the structure that the phases of corrugations in adjoining regions are reverse to each other.

Figure 2:
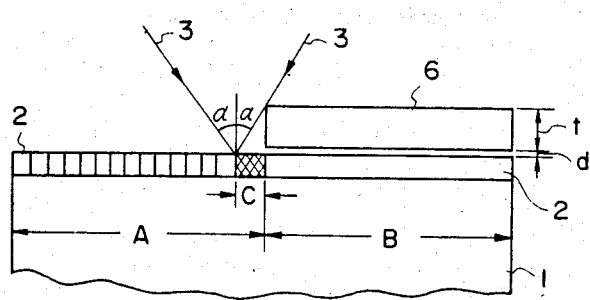
FIG. 2 is a schematic diagram showing the manufacture of a diffraction grating in which the phase of corrugations is partly reversed, through the use of the conventional two-beam interference exposure method.
Figure 3A:
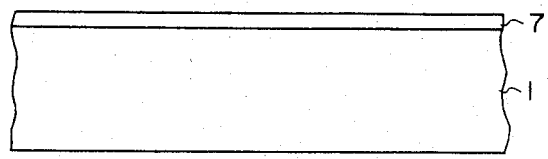
FIGS. 3A to 3J show a sequence of steps involved in the manufacture of a diffraction grating according to the present invention.
Figure 3B:
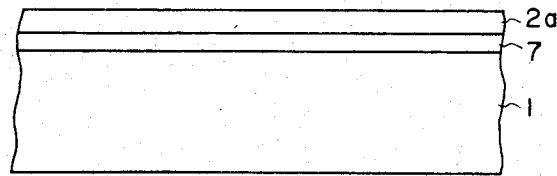
Figure 3C:
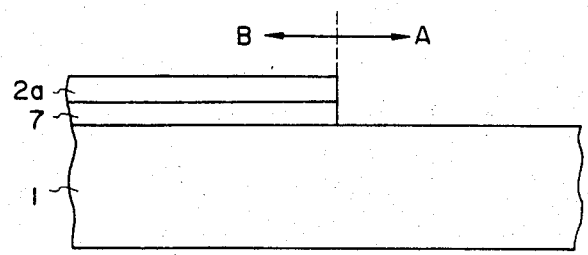
Figure 3D:
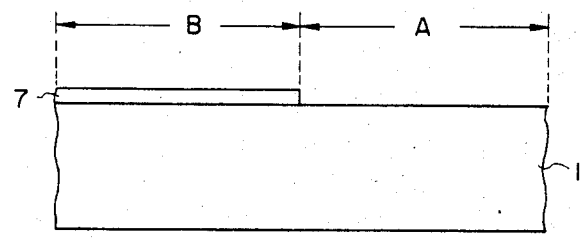
Figure 3E:
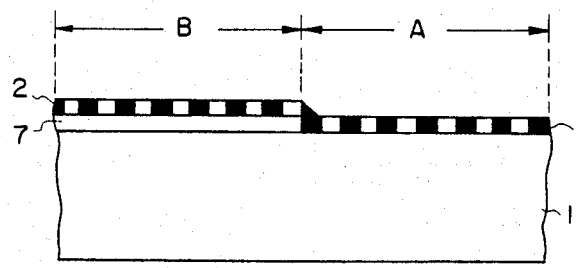
Figure 3F:
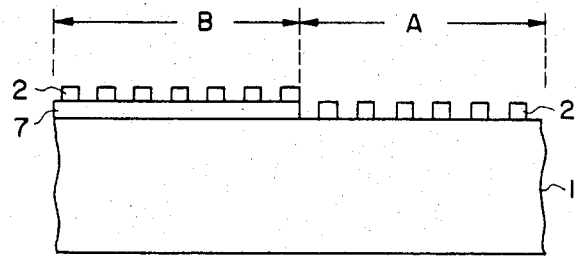
Figure 3G:
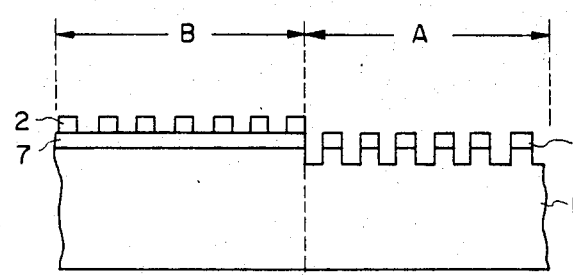
Figure 3H:
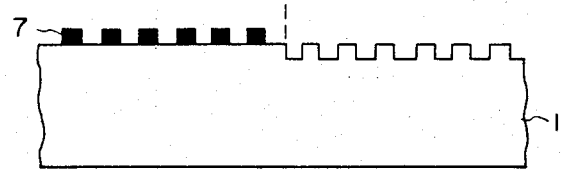
Figure 3I:
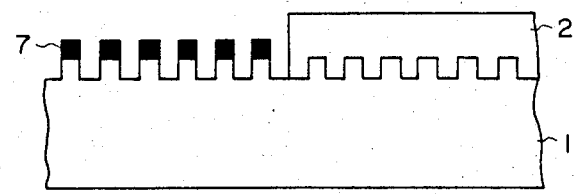
Figure 3J:
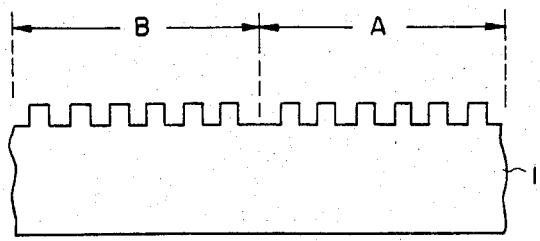

(1) FIG. 2 is a schematic diagram showing the manufacture of the diffraction grating having the phase-inverted structure through the use of the aforementioned two-beam interference exposure process. FIG. 2 shows a case of forming periodic corrugations in a region A, and in this case, a region B is covered with a metal mask 6 having a thickness t (approximately 50 $\mu$m). Usually, a gap d (about several $\mu$m) is defined between the metal mask and the photoresist film 2. An interference pattern is shown to be the nearest to the region B, but as is evident from FIG. 2, there is a region C which is not exposed to the irradiation by the laser light 3 under the influence of the thickness of the metal mask 6, that is, where no corrugations are formed. In case of subjecting the region B to the two-beam interference exposure after forming the metal mask 6 on the region A, there is similarly the region C where no corrugations are formed. That is, no corrugations are formed over an area twice longer than the region C as a whole.

Assuming, for example, that the period $\Lambda$ of corrugations of the diffraction grating is 2400 Å and the wavelength $\lambda_0$ of the He-Cd laser is 3250 Å, the incident angle $\alpha$ is as follows:

$$\alpha = \sin^{-1}\left(\frac{\lambda_0}{2\Lambda}\right) = \sin^{-1}\left(\frac{3250}{4800}\right) \approx 43 \text{ [degrees]}.$$

Letting the thickness t of the mask be equal to 50 $\mu$m and the gap be represented by d, the region C where no periodic corrugations are formed is as follows:

$$C=(t+d) \tan \alpha \approx t \cdot \tan \alpha = 47 \text{ [}\mu\text{m]}.$$

Therefore, the non-corrugated region, which accompanies the two two-beam interference exposure operations, becomes twice as long as the region C, that is, 94 [$\mu$m]. As a result of this, since the entire length of the light emitting region is usually several hundred [$\mu$m], the working current of the DFB laser increases and its single-wavelength operation also becomes unstable. A proposed solution to this problem is to decrease the thickness t of the metal mask 6 or to taper the upper edge of the inner side of the metal mask 6, by which some improvements can be produced, but there still remains the region C where no irregularities are formed.

(2) In order to reverse the phase of corrugations through 180 degrees, the substrate 1 must be moved accurately by a distance (about 1000 Å) equal to one-half the period $\Lambda$ of corrugations when exposing the region B after the exposure of the region A. However, it is extremely difficult to move the substrate 1 accurately about 1000 Å (0.1 $\mu$m); and this is very difficult in terms of reproducibility, The present invention will hereinafter be described in detail.

FIGS. 3A to 3J illustrate an embodiment of the present invention, schematically showing a sequence of steps involved in the manufacture of the diffraction grating with reverse-phased corrugations.

(a) An N film 7 is coated by a conventional method on the substrate 1.

(b) An auxiliary P film 2a is formed on the N film 7 so as to remove the N film 7 in a region B without exposing it to light.

(c) The auxiliary P film 2a in a first region A of the diffraction grating is removed by ordinary masked exposure, after which the N film 7 in the region A is also removed, using the P film 2 in the second region B as an etching mask.

(d) The auxiliary P film 2a in the region B is removed as by an organic solvent.

(e) Next, the P film 2 is formed all over the regions A and B. This step forms the basis for producing the diffraction grating with reverse-phased corrugations by one uniform two-beam interference exposure described next. That is, this step makes unnecessary such movement of the substrate as is needed in the prior art. Further, a surface step is formed at the boundary between the regions A and B, but since the thickness of the N film 7 is very small (usually 0.1 $\mu$m or so), there are substantially no possibilities of the region C being formed as in the past.

(f) By performing the uniform two-beam interference exposure, the interference light is intensified, by which are formed concavities in the P film 2 of the exposed portion and convexities in the P film 2 of the unexposed portion, thus providing periodic corrugations as a whole, as shown. In this stage, however, the corrugations in the regions A and B are not reverse in phase to each other as yet.

(g) Corrugations are formed in the substrate 1 of the region A by chemical etching through using the corrugations of the P film 2 as a mask.

(h) The entire area of the surface of the N film 7 in the region B is subjected to ordinary exposure using the corrugations of the P film 2, after which the P films 2 of the regions A and B are removed by an ordinary developing technique, and further, the N film is developed. Incidentially, since the exposed portions of the N film 7 remain unremoved as convexities, the corrugations in the regions A and B are reversed in this stage.

(i) An additional mask 2b of the P film is formed by masked exposure in the region A alone, and corrugations are formed by chemical etching in the substrate 1 of the region B using the corrugations of the N film 7 in the region B.

(j) The corrugations of the N film 7 in the region B and the P film 2b in the region A are removed, by which is obtained a diffraction grating in which the corrugations are reversed in phase near the center of the substrate 1.

FIGS. 4A to 4F illustrate another embodiment of the present invention, schematically showing a sequence of steps involved in the diffraction grating with reverse-phased corrugations.

(a) The N film 7 is formed by a conventional coating method over the entire area of the surface of the substrate 1.

(b) The P film 2 is formed on the N film 7.

(c) The P film 2 in the region A is removed. By this, the surfaces of the regions A and B are formed by different types of photoresist films, in accordance with the characteristic feature of the present invention.

(d) The two-beam interference exposure is performed once. Since the region A is covered with the N film 7, its exposed portions form convexities and its unexposed portions concavities. On the other hand, since the region B is covered with the P film 2, there are formed corrugations exactly opposite from those in the negative type film region. Accordingly, the phases of the corrugations in the regions A and B are reverse to each other. Further, there is formed between the regions A and B a surface step equal to the thickness of the P film 2, but since the P film 2 is very thin (0.1 μm or so), there is hardly provided the region C where no corrugations are formed as in the prior art.

Figure 4A:
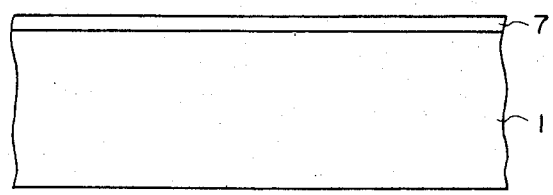
Figure 4B:
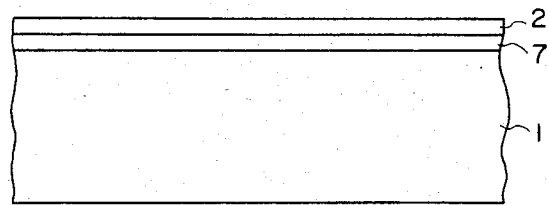
Figure 4C:
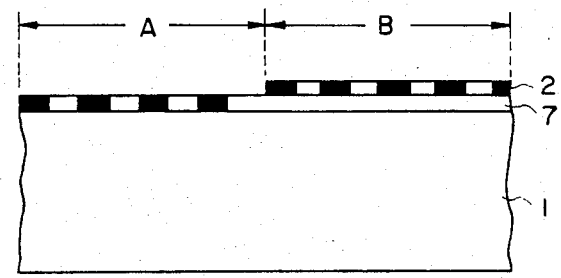
Figure 4D:
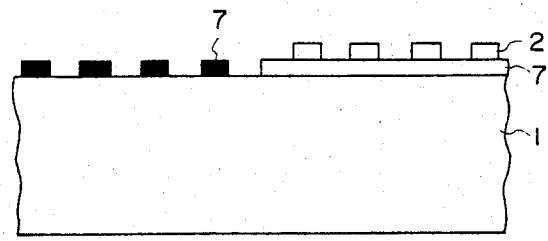
Figure 4E:
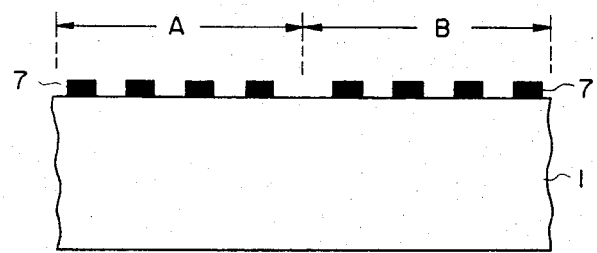
Figure 4F:
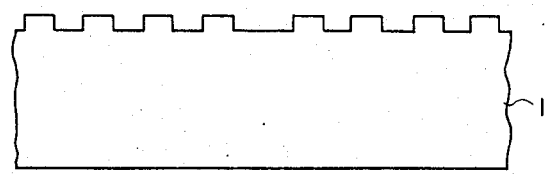
Figure 5A:
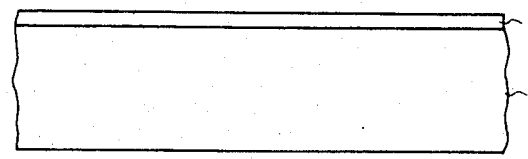
Figure 5B:
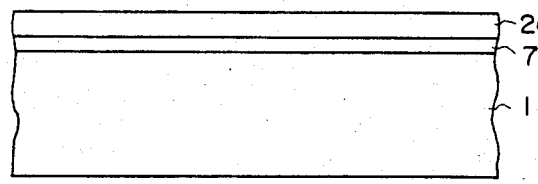
Figure 5C:
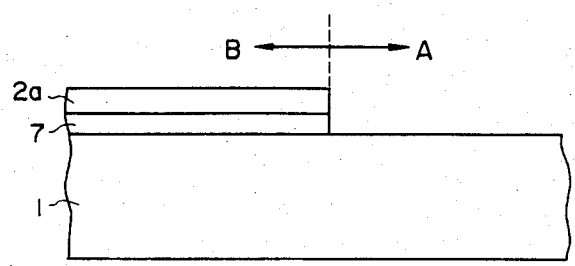
Figure 5D:
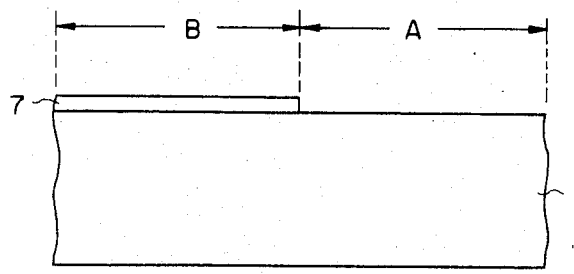
Figure 5E:
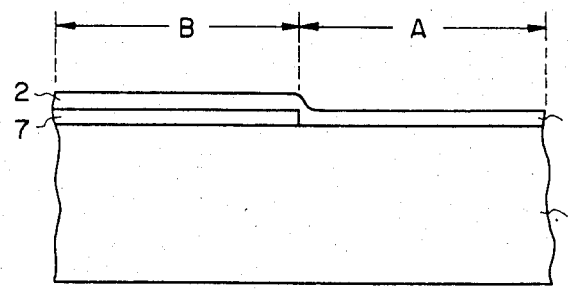
Figure 5F:
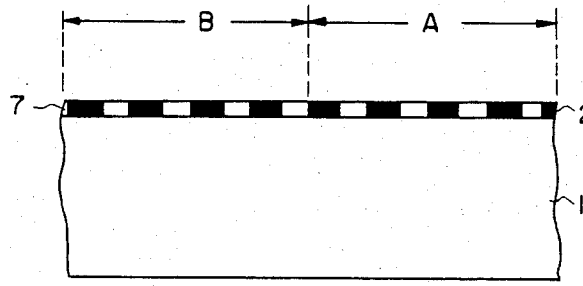
Figure 5G:
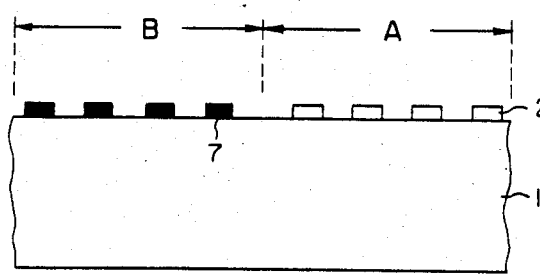
Figure 5H:
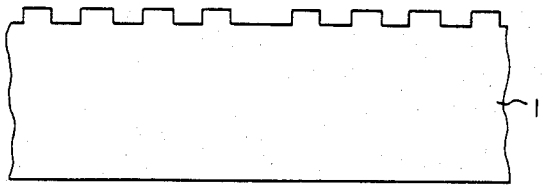
Figures 6A, 6B:
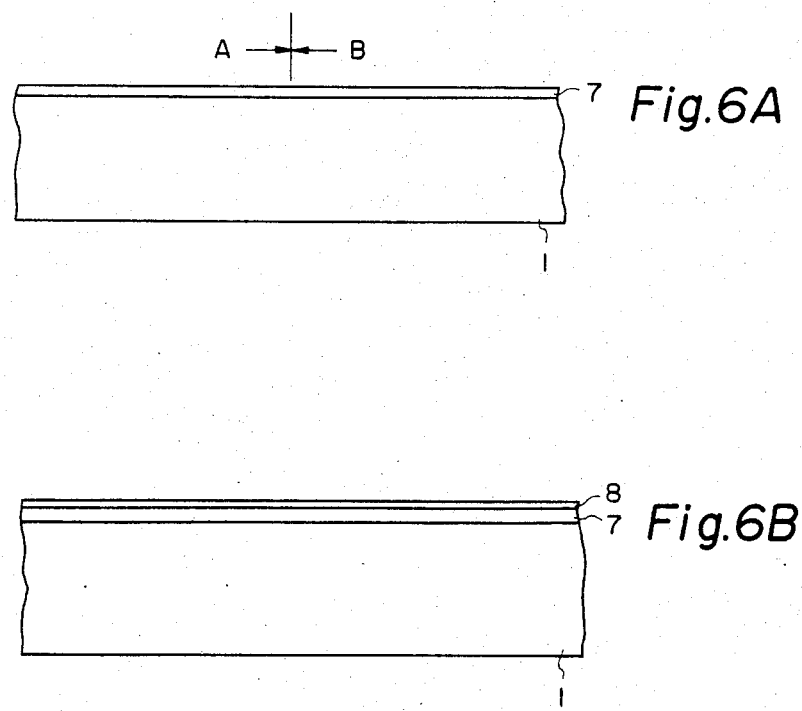
Figure 6C:
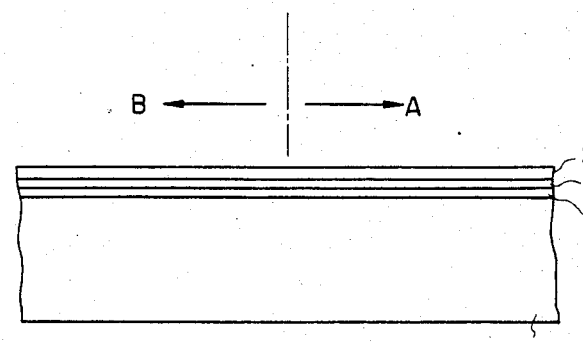
Figure 6D:
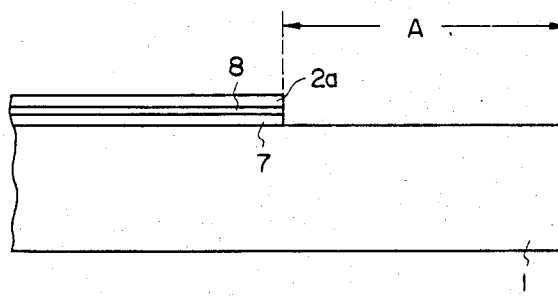
Figure 6E:
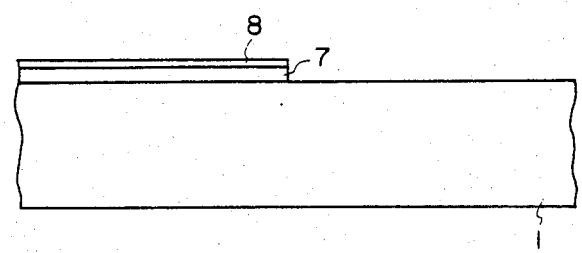
Figure 6F:
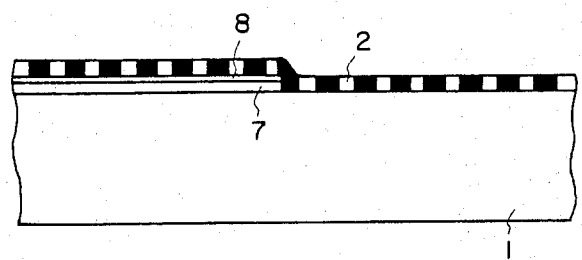
Figure 6G:
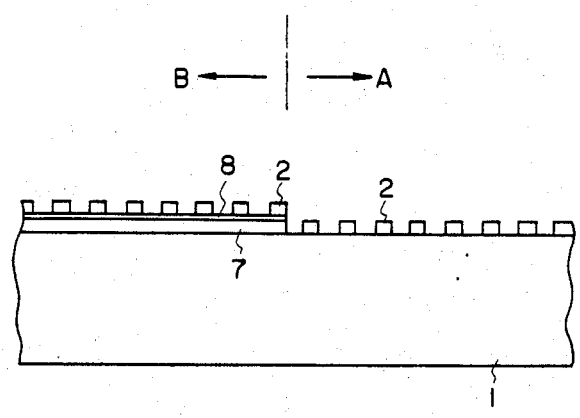
Figure 6H:
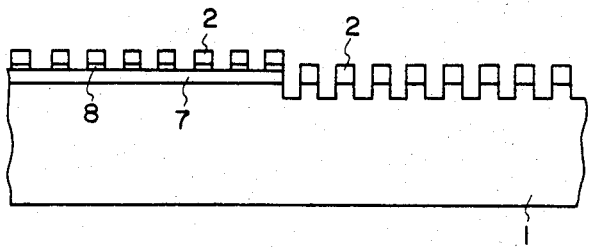
Figure 6I:
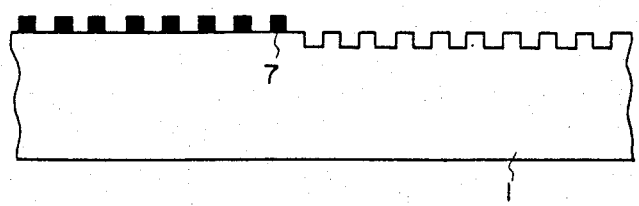
Figure 6J:
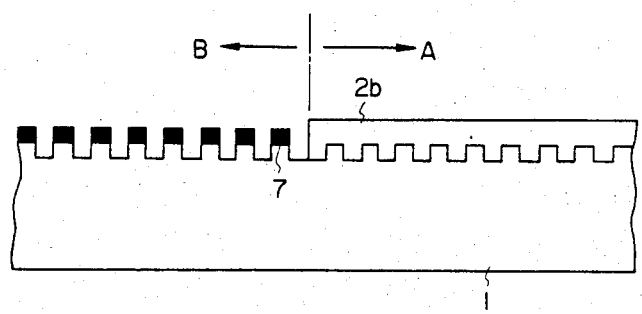
Figure 6K:
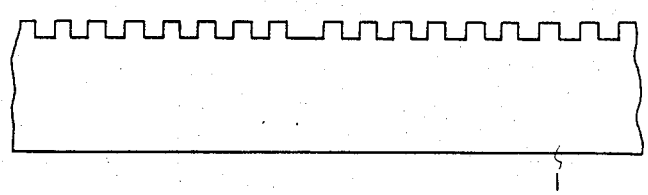

(e) In the above step (d), the N film 7 in each concavity of the P film 2 in the region B is removed by an ordinary N film developing technique, and then the corrugations of the P film 2 are removed. Consequently, corrugations of the N film 7 of opposite phases are formed in the regions A and B, as shown in FIG. 4E. (However, the corrugations of the P film 2 need not be removed.)

(f) After forming corrugations in the substrate 1 by chemical etching through using the corrugations of the N film 7 as a mask, the N film 7 is removed, thus forming the desired diffraction grating.

As is evident from the above steps, according to the present invention, by laminating different types of photoresist films on the surfaces of the regions A and B, it is possible to produce a high precision diffraction grating with phase-reversed corrugations by one two-beam interference exposure step.

FIGS. 5A to 5H illustrate another embodiment of the present invention, in which different types of photoresist films are coated in the regions A and B.

(a) The N film 7 is coated by a conventional method on the substrate 1.

(b) The additional P film 2a is formed so as to remove the N film 7 of the region B without exposing it to light.

(c) The additional P film 2a in the first region A of the diffraction grating is removed by ordinary masked exposure, and further, the N film 7 in the region A is also removed through using the additional P film 2a in the second region B of the diffraction grating as an etching mask.

(d) The additional P film 2a in the region B is removed.

(e) The P film 2 is formed in the regions A and B.

(f) The P film 2 in the region A is removed by masked exposure, thereby providing different types of photoresist films in the regions A and B.

(g) By the uniform two-beam interference exposure, there are formed corrugations of the N film 7 in the region B and corrugations of the P film 2 in the region A, that is, the corrugations in the respective regions are reverse in phase to each other.

(h) Next, the substrate 1 is selectively etched away through using the corrugations of the N film 7 and the P film 2 as masks and then the N film 7 and the P film 2 are removed, providing the desired diffraction grating.

As described above, according to this embodiment of the present invention in which different types of photoresist films are formed on the substrate, the diffraction grating having the structure that the corrugations are reverse in phase can be produced by the conventional uniform two-beam interference exposure and etching. FIGS. 3 to 5 show a case where when exposing the P film 2 and the additional P film 2a, light does not essentially reach the N film according to exposure conditions (the wavelength and intensity of the light and the exposure time, etc.) or by virtue of the light absorption characteristic of the P film. Next, a description will be given, with reference to FIGS. 6A to 6K, of an embodiment in which the light applied to the P film for exposure essentially reaches a part of the N film 7 according to the exposure conditions (the wavelength and intensity of light, the exposure time, etc.) or by virtue of the light absorption characteristic of the P film.

(a) The N film 7 is formed over the entire area of the surface of the substrate 1.

(b) An ultraviolet rays absorbing film or a reflecting film 8 such as a gold thin film is laminated on the N film 7 so as to remove the N film 7 in the first region without exposing the N film 7 in the second region to light.

(c) Further, the additional P film 2a is laminated.

(d) The additional P film 2a in the first region A of the diffraction grating is removed by ordinary masked exposure, and further, the reflecting film 8 and the N film 7 in the region A are removed through using the additional P film 2a in the second region B of the diffraction grating as an etching mask.

(e) Next, the additional P film 2a in the region B is removed as by an organic solvent, leaving the reflecting film 8 and the N film 7 only in the region B.

(f) The film 2 is formed all over the regions A and B.

(g) By performing the two-beam interference exposure, periodic corrugations are formed by the P film 2.

(h) Corrugations are formed by chemical etching in the substrate 1 in the region A using the corrugations of the P film 2 as a mask. Next, the reflecting film 8 in the concavities of the P film 2 in the region B is removed.

(i) Further, the N film 7 in the region B is exposed to light using the reflecting film 8 as a mask and then the P film 2 and the reflecting film 8 are removed. The P film 2 in the region A is also removed. Since the exposed portions of the N film 7 remain unremoved (removed in the case of the P film), corrugations of opposite phases are formed in the regions A and B in this stage.

(j) The additional film 2b is formed only in the region A, and in the region B, corrugations are formed by chemical etching in the substrate of the region B using the corrugations of the N film 7 as a mask.

(k) The N film 7 in the region B and the additional P film 2b in the region A are removed, obtaining the diffraction grating of different phases in the regions A and B.

A description will be given, with reference to FIGS. 7A to 7J, of still another embodiment of the present invention. This embodiment is to expose at a time a laminated film composed of P and N films through effective utilization of the exposure conditions under which light applied to the P film essentially passes through the N film 7.

(a) The auxiliary P film 2a is coated uniformly all over the substrate 1, after which the auxiliary P film 2a in the second region B is removed by exposure through a mask.

(b) The N film 7 is coated over the entire area of the surface of the substrate 1 from which the auxiliary P film 2a has been removed in the region B.

(c) By the lift-off of the auxiliary P film 2a, the N film 7 is left unremoved in the second region B alone.

Figure 7A:
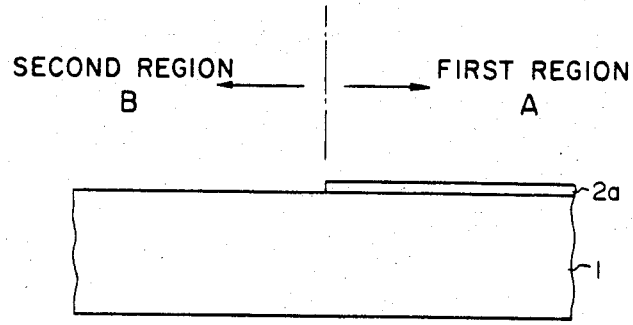
Figure 7B:
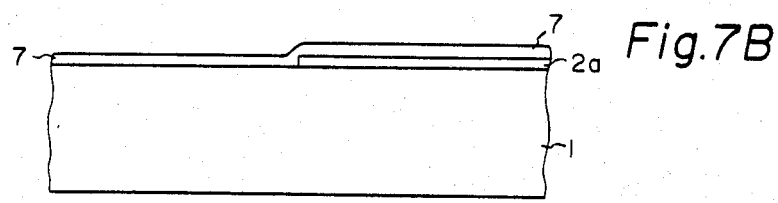
Figure 7C:
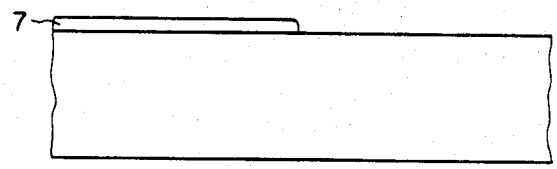
Figure 7D:
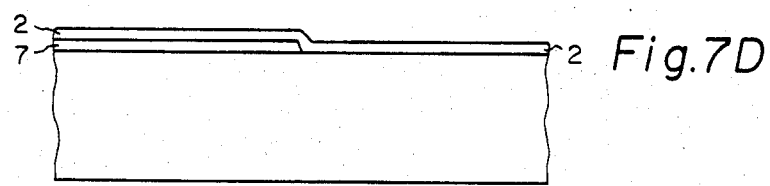

(d) The P film 2 is coated over the entire area of the surface of the substrate 1 subjected to the step (FIG. 7C).

(e) The two-beam interference exposure is carried out. The black portions are exposed portions.

(f) The P film 2 is subjected to development, forming corrugations of the P film 2.

(g) The substrate 1 in the first region A is subjected to etching.

(h) The P film 2 is removed and the N film 7 is developed, forming corrugations of the N film 7 in the second region B.

(i) An additional P film 2b is formed in the region A by exposure through a mask, and then the substrate 1 in the second region B is subjected to etching.

(j) The additional P film 2b and the N film 7 are removed.

Figure 7E:
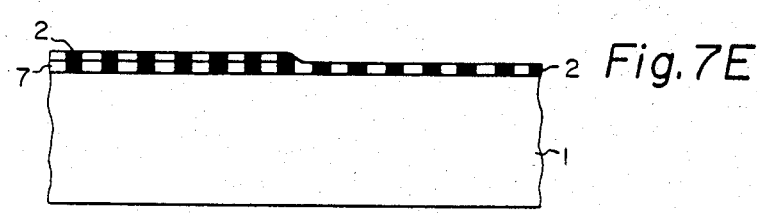
Figure 7F:
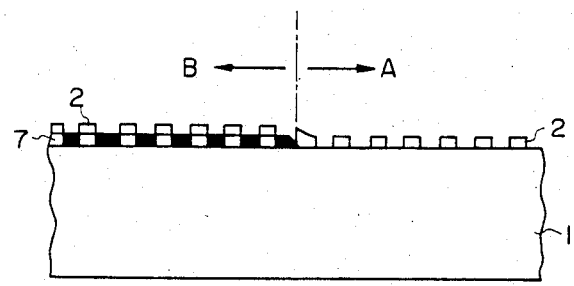
Figure 7G:
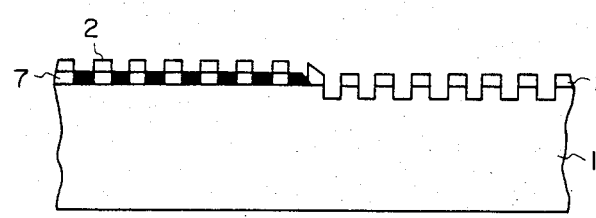
Figure 7H:
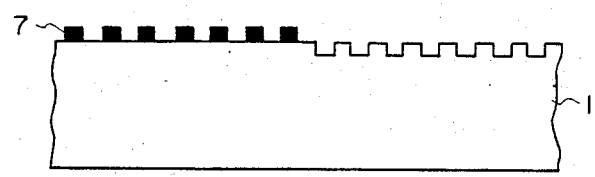
Figure 7I:
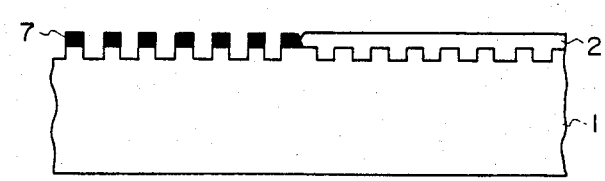
Figure 7J:
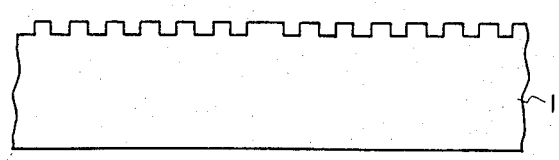

As will be apparent from the above steps, according to the present invention, since only one two-beam interference exposure step is employed, the substrate 1 need not be moved, and since the metal mask 6 need not be provided for the two-beam interference exposure, there is not produced a region where no corrugations are formed (the region C). Therefore, it is possible to obtain a diffraction grating having an accurate phase reversal. Accordingly, the present invention is applicable to DFB lasers desired to be stable in operation and excellent in characteristic, and hence is of great utility. Incidentally, the embodiments of FIGS. 3, 4 and 5 have been described on the assumption that the P film 2 is excellent in the absorption of ultraviolet rays, but if the absorption of ultraviolet rays by the P film 2 is not sufficient, it is necessary only to form a reflecting film as of an ultraviolet rays absorbing film or gold thin film between the P film 2 and the N film 7, as shown in FIG. 6, and it is also effective to expose the P film and the N film at the same time, as shown in FIG. 7E. Further, no detailed and concrete description has been given of the exposure through a mask, the development step after exposure and the photoresist coating, but ordinary photoresist techniques are employed.

In the above examples of the present invention, it is premised to use, as the negative type photoresist, a material of the cyclorubber series widely employed. Through the use of negative type novolac systems which have substantially the same chemical properties as the positive type photoresist, another example of the present invention is aimed at simplifying the entire manufacturing process and, at the same time, providing a phase-inverted diffraction grating of good quality through utilization of the high resolution property of the photoresist of the novolac systems.

FIGS. 8A to 8F illustrate an embodiment of the present invention, schematically showing a sequence of steps involved in the manufacture of the diffraction grating having the structure in which the phase of corrugations is reversed.

(a) A P film 2 is coated over the entire area of the substrate 1, after which only the first region is exposed to light through a mask in an ordinary manner and the P film in the first region is removed.

(b) An N film 7 is coated all over the surface of the substrate so that the N film is formed on the substrate surface in the first region and on the P film in the second region. This is a first step. When using, as the negative type photoresist, the photoresist of the novolac systems which is the same systems as the positive type photoresist, they may sometimes get mixed at the boundary between the P film and the N films, but this can be avoided by treating the surface of the P film with chlorocarbon or the like and heat-treating it properly by employing a metal film, such as a gold film, or an $SiO_2$ film intervened between the P film and the N film.

(c) The first region and the second region are subjected to two-beam interference exposure. The black portions are those exposed to the interference exposure. This is a second step.

(d) The first region and the second region are developed. Since the P film 2 and the N film 7 are both photoresist films of the novolac systems, the same developer can be used in common to them, but it will be more effective to immerse the substrate assembly in a developer exclusive for the N film 7, to rinse it with pure water and to immerse it in a developer exclusive for the P film 2.

(e) The substrate 1 is selectively etched away using, as a mask, the diffraction-grating-like photoresist film formed by the P film 2 and the N film 7 after development.

(f) The P film 2 and the N film 7 are removed, obtaining a diffraction grating substrate in which corrugations in the first region and the second region are reverse in phase to each other. This is a third step.

Since the negative type photoresist of the novolac systems, when exposed to light in the air, is less desensitized than a photoresist of the cyclorubber systems, the N film 7 may be exposed to light as it is exposed in the air, as shown in FIG. 8C. It is needless to say, however, that the desensitization of the N film 7 can be further decreased by coating it with a thin P film 2 or the like, or by exposing it to light in a nitrogen atmosphere.

As will be appreciated from the above manufacturing steps, according to the present invention, since only one two-beam interference exposure step is employed, the substrate 1 need not be moved, and since the metal mask 6 need not be provided for the two-beam interference exposure, there is not produced a region where no corrugations are formed (the region C). This ensures the fabrication of a diffraction grating having an accurate phase reversal. Accordingly, the diffraction grating of the present invention is applicable to DFB lasers or the like of stable operation and excellent characteristics, and its effect is very great. Although no detailed and concrete description has been given of the exposure through a mask, the development step after the exposure and the photoresist coating, ordinary photoresist techniques are employed.

What we claim is:

1. A diffraction grating manufacturing method including a first step of forming, on a substrate, a structure in which a negative type photoresist film is formed in a first region alone and the negative type photoresist film is formed on a positive type photoresist film in a second region; a second step of subjecting the first region and the second region of the substrate to two-beam interference exposure; and a third step of forming, through utilization of characteristics of the negative type photoresist film and the positive type photoresist film, a diffraction grating in which corrugations in the first region and the second region are reverse in phase to each other.

2. A diffraction grating manufacturing method including a first step of forming, on a substrate, a structure in which a positive type photoresist film is formed in a first region and a negative type photoresist film is formed in a second region adjacent to the first region; a second step of subjecting the first region and the second region of the substrate to two-beam interference exposure; and a third step of forming, through utilization of the negative type characteristic and the positive type characteristic of the photoresist films a diffraction grating in which corrugations in the first region and the second region are reverse in phase to each other.

3. A diffraction grating manufacturing method according to claim 2, characterized in that in the first step, the negative type photoresist film and an auxiliary positive type photoresist film are laminated over the entire area of the substrate surface, the laminate film in the first region is removed by exposure through a mask and development, the auxiliary positive type photoresist film in the second region is removed, the positive type photoresist film is formed all over the substrate surface and then the positive type photoresist film in the second region is removed by exposure through a mask and development, thereby forming the negative type photoresist film in the second region and the positive type photoresist film in the first region.

4. A diffraction grating manufacturing method including a first step of forming, on a substrate, a structure in which a positive type photoresist film is formed in a first region and a positive type photoresist film is formed on a negative type photoresist film in a second region adjacent to the first region; a second step of subjecting the first region and the second region of the substrate to two-beam interference exposure; and a third step of forming, through utilization of the negative type characteristic and the positive type characteristic of the photoresist films, a diffraction grating in which corrugations in the first region and the second region are reverse in phase to each other.

5. A diffraction grating manufacturing method according to claim 4, characterized in that in the first step, the negative type photoresist film and an auxiliary positive type photoresist film are laminated one on the other over the entire area of the substrate surface, the laminate film in the first region is removed by exposure through a mask and development, the auxiliary positive type photoresist film in the second region is removed and then the positive type photoresist film is formed all over the substrate surface, thereby forming the positive type photoresist film on the negative type photoresist film in the second region and the positive type photoresist film in the first region.

6. A diffraction grating manufacturing method according to claim 4, characterized in that in the first step, the negative type photoresist film, an interposed thin film for absorbing or reflecting ultraviolet rays and an auxiliary positive type photoresist film are successively laminated over the entire area of the substrate surface, the laminate film in the first region is removed by exposure through a mask and development, the auxiliary positive type photoresist film in the second region is removed and then the positive type photoresist film is formed all over the substrate surface, thereby forming the positive type photoresist film on the negative type photoresist film through the interposed thin film in the second region and the positive type photoresist film in the first region.

7. A diffraction grating manufacturing method according to claim 4, characterized in that in the first step, an auxiliary positive type photoresist film is formed over the entire area of the substrate surface, the auxiliary positive type photoresist film in the second region is removed by exposure through a mask and development, the negative type photoresist film is formed all over the substrate surface, the auxiliary positive type photoresist film and the negative type photoresist film in the first region are removed by a lift-off technique and then the positive type photoresist film is formed all over the substrate surface, thereby forming the positive type photoresist film in the first region and the positive type photoresist film on the negative type photoresist film in the second region.

8. A diffraction grating manufacturing method including a first step of forming, on a substrate, a structure in which a negative type photoresist film is formed in a first region and a positive type photoresist film is formed on a negative type photoresist film in a second region adjacent to the first region; a second step of subjecting the first region and the second region of the substrate to two-beam interference exposure; and a third step of forming, through utilization of the negative type characteristic and the positive type characteristic of the photoresist films, a diffraction grating in which corrugations in the first region and the second region are reverse in phase to each other.

9. A diffraction grating manufacturing method according to claim 8, characterized in that in the first step, the negative type photoresist film and the positive type photoresist film are formed one on the other over the entire area of the substrate surface and the positive type photoresist film in the first region is removed by exposure through a mask and development, thereby forming the negative type photoresist film in the first region and the positive type photoresist film on the negative type photoresist film in the second region.

* * * * *